US010883174B2

(12) United States Patent
Lau et al.

(10) Patent No.: US 10,883,174 B2
(45) Date of Patent: Jan. 5, 2021

(54) GAS DIFFUSER MOUNTING PLATE FOR REDUCED PARTICLE GENERATION

(71) Applicant: Applied Materials, Inc., Santa Clara, CA (US)

(72) Inventors: Allen K. Lau, Cupertino, CA (US); Hsiang An, Taichung (TW); Lai Zhao, Campbell, CA (US); Jianhua Zhou, Campbell, CA (US); Robin L. Tiner, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 136 days.

(21) Appl. No.: 16/201,755

(22) Filed: Nov. 27, 2018

(65) Prior Publication Data

US 2020/0165726 A1 May 28, 2020

(51) Int. Cl.
*C23C 16/455* (2006.01)
*C23C 16/50* (2006.01)
*H01J 37/32* (2006.01)

(52) U.S. Cl.
CPC .. *C23C 16/45563* (2013.01); *C23C 16/45591* (2013.01); *C23C 16/50* (2013.01); *H01J 37/3244* (2013.01); *H01J 37/32449* (2013.01)

(58) Field of Classification Search
CPC ....... C23C 16/45563–45593; C23C 16/45508; C23C 16/45506; C23C 16/45591; H01J 37/3244; H01J 37/32449
USPC ...................................... 156/345.33–345.34
See application file for complete search history.

(56) References Cited

U.S. PATENT DOCUMENTS

| 4,893,941 A * | 1/1990 | Wayte ................ B01F 7/00241 366/265 |
| 5,444,217 A * | 8/1995 | Moore ................ C23C 16/4404 219/405 |
| 5,643,394 A | 7/1997 | Maydan et al. |
| 5,685,281 A * | 11/1997 | Li .......................... F02M 29/06 123/590 |
| 5,962,822 A * | 10/1999 | May ....................... F01N 1/083 181/258 |
| 6,450,117 B1 * | 9/2002 | Murugesh ........... C23C 16/4402 118/723 ER |
| 6,461,436 B1 | 10/2002 | Littau et al. |
| 7,429,403 B2 * | 9/2008 | Wheat ..................... C23C 10/06 427/248.1 |
| 7,682,946 B2 * | 3/2010 | Ma ..................... C23C 16/45544 438/481 |

(Continued)

FOREIGN PATENT DOCUMENTS

KR    10-1029695 B1    4/2011

OTHER PUBLICATIONS

International Search Report and Written Opinion for Application No. PCT/US2019/057947 dated Feb. 12, 2020.

*Primary Examiner* — Aiden Lee
(74) *Attorney, Agent, or Firm* — Patterson + Sheridan LLP

(57) ABSTRACT

Embodiments of the present disclosure generally provide apparatus and methods for a gas diffuser assembly for a vacuum chamber, the gas diffuser assembly comprising a mounting plate, the mounting plate comprising a hub, a plurality of curved spokes extending from the hub in a radial direction, a gusset portion coupled between the hub and each of the curved spokes, each of the gusset portions having a convex curve disposed in an axial direction, and one or more mounting holes coupled to the curved spokes.

20 Claims, 5 Drawing Sheets

(56) References Cited

U.S. PATENT DOCUMENTS

| | | | |
|---|---|---|---|
| 8,910,644 B2* | 12/2014 | Chung | B08B 5/00 |
| | | | 134/117 |
| 2003/0010451 A1* | 1/2003 | Tzu | C23C 16/45512 |
| | | | 156/345.33 |
| 2003/0198740 A1* | 10/2003 | Wendling | C23C 16/45591 |
| | | | 427/248.1 |
| 2005/0199184 A1 | 9/2005 | Murugesh et al. | |
| 2006/0174827 A1* | 8/2006 | Bae | C23C 16/45589 |
| | | | 117/200 |
| 2007/0022952 A1 | 2/2007 | Ritchie et al. | |
| 2007/0241023 A1* | 10/2007 | Ootsubo | B65D 77/225 |
| | | | 206/524.8 |
| 2008/0193646 A1* | 8/2008 | Suzuki | C23C 16/45519 |
| | | | 427/255.28 |
| 2013/0004681 A1 | 1/2013 | Tso et al. | |
| 2014/0224176 A1* | 8/2014 | Rhee | C23C 16/4401 |
| | | | 118/724 |
| 2016/0189936 A1 | 6/2016 | Chia et al. | |

* cited by examiner

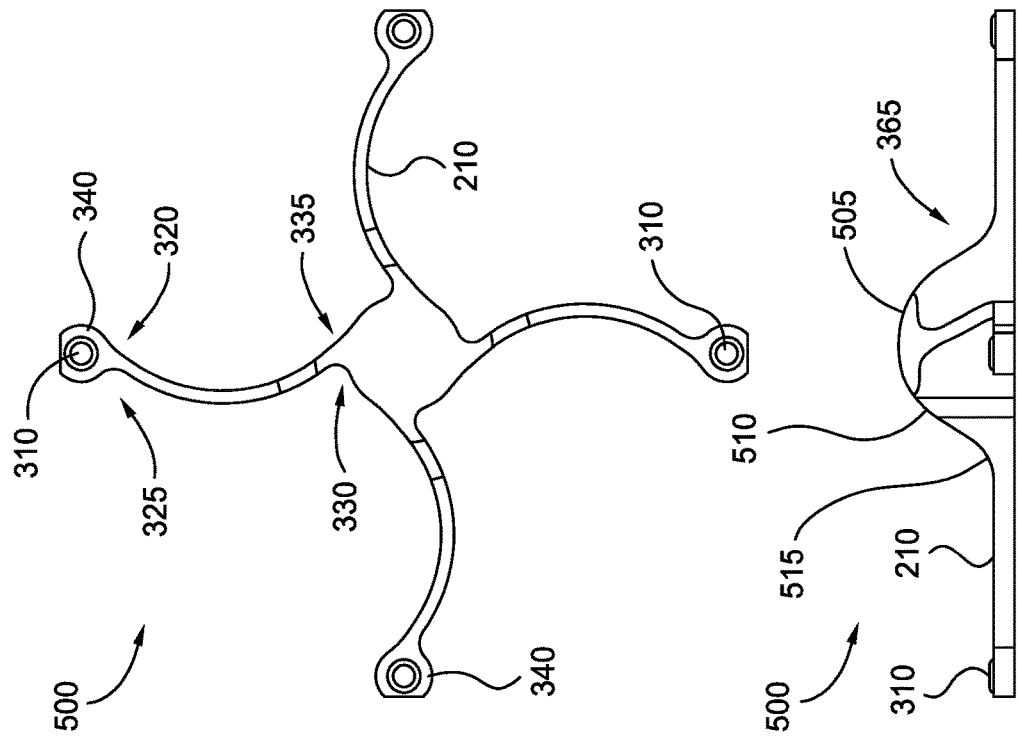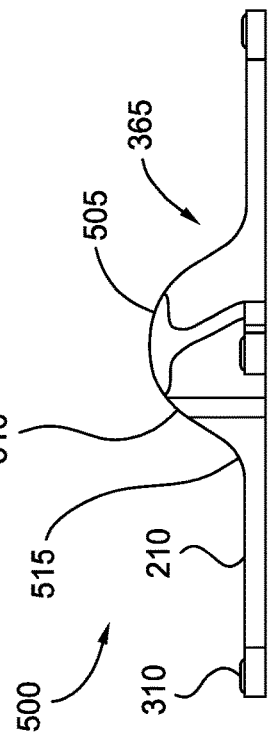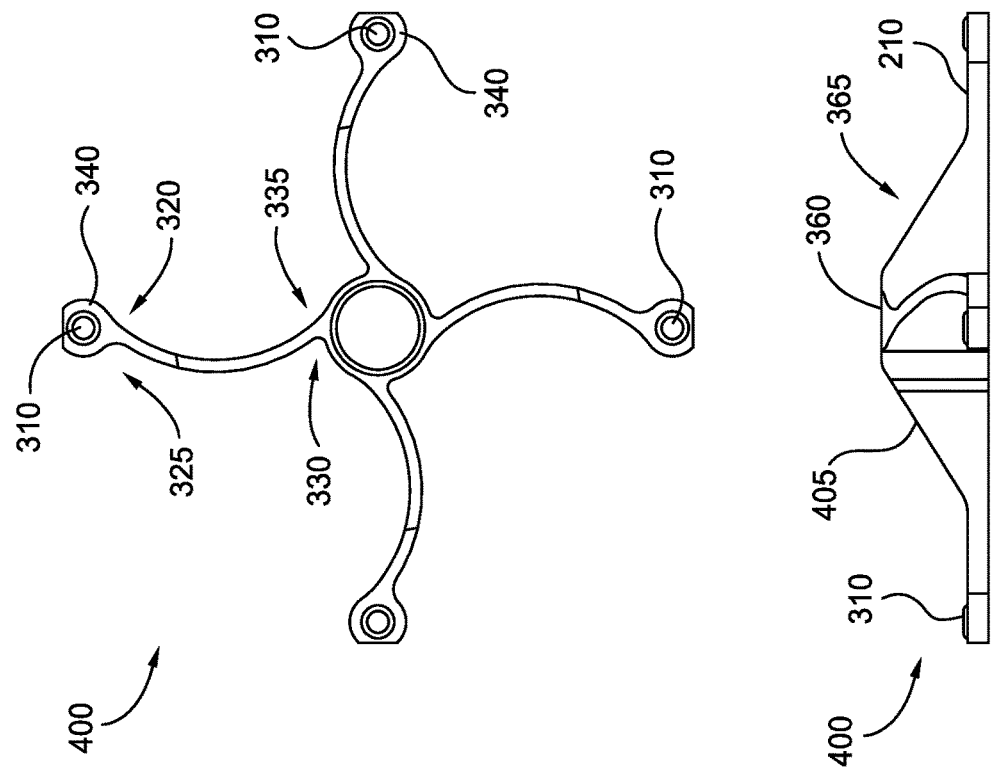

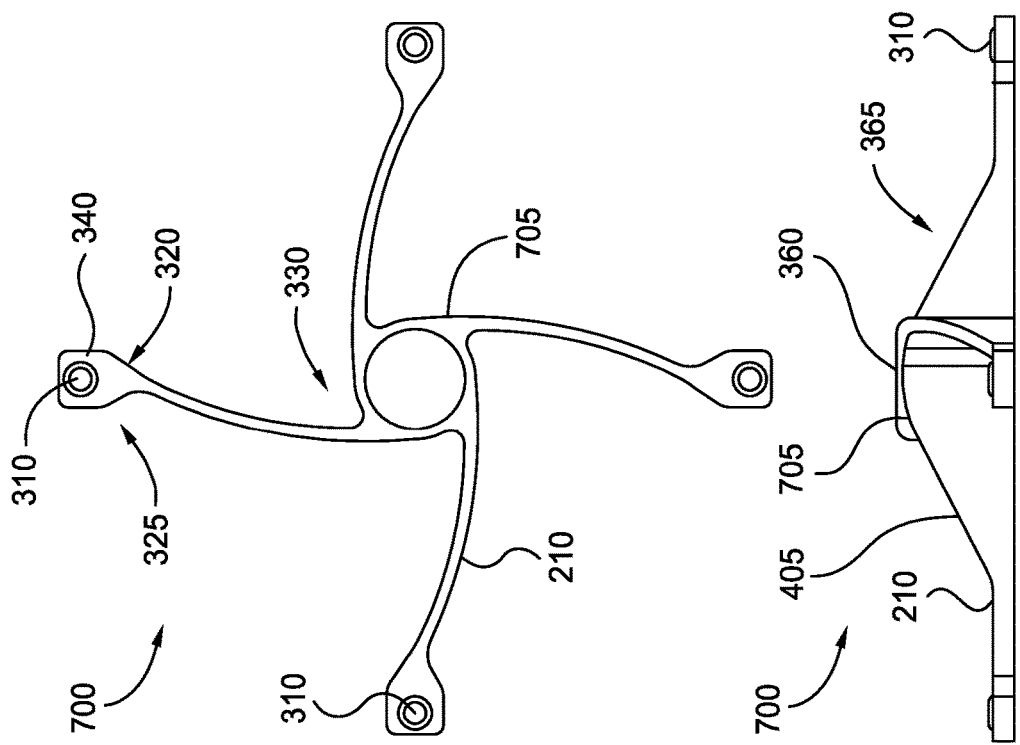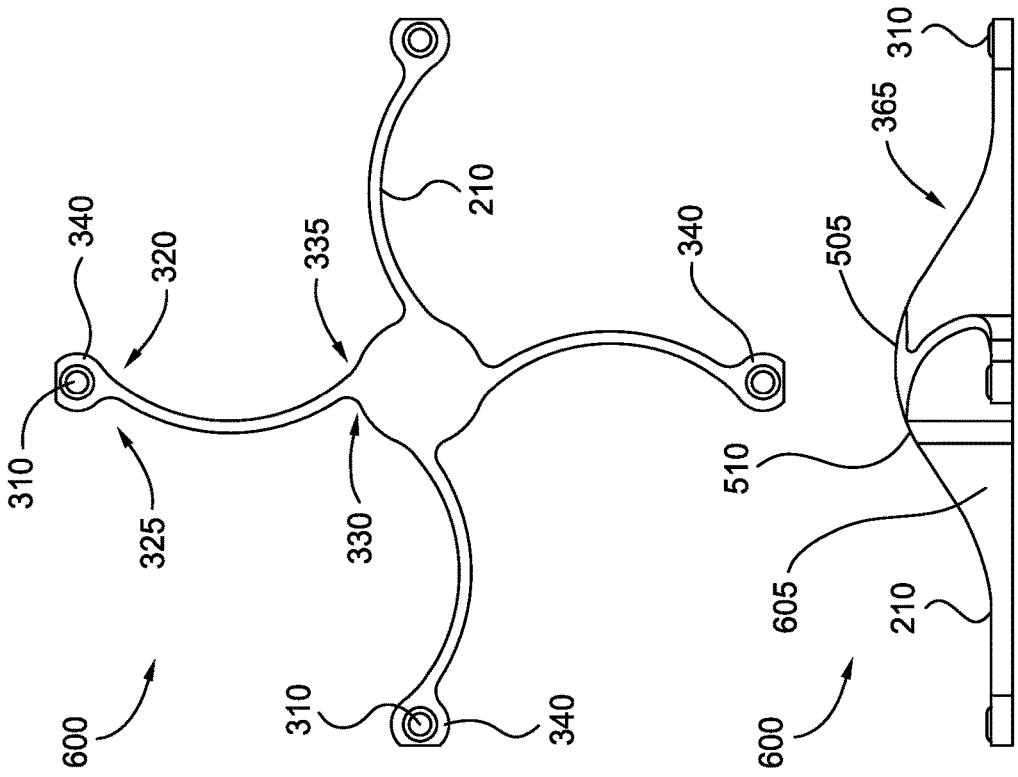

GAS DIFFUSER MOUNTING PLATE FOR REDUCED PARTICLE GENERATION

BACKGROUND

Field

Embodiments of the present disclosure generally relate to a mounting plate for a gas or plasma diffuser utilized in a plasma chamber.

Description of the Related Art

Plasma enhanced chemical vapor deposition (PECVD) is a deposition method whereby processing gas is introduced into a processing chamber through a backing plate, through a diffuser and then to a gas distribution showerhead. The showerhead is electrically biased to ignite the processing gas into a plasma. A pedestal, sitting opposite to the showerhead, is electrically grounded and functions as an anode as well as a substrate support. The plasma of processing gases forms one or more films on the substrate.

Periodic chamber cleaning of interior chamber components is performed by flowing a plasma of cleaning gas radicals along and through the same flow path as the processing gases. For example, the cleaning gases are ignited into a plasma outside of the processing chamber and flow through the backing plate, the diffuser, and through the showerhead. The plasma of cleaning gas radicals is typically about 400 degrees Celsius, or greater, and causes portions of the flow path to expand. After cleaning, the portions of the gas path gradually cool. This thermal cycling is repeated multiple times during a production period.

However, the thermal cycling causes portions of the gas path to expand or contract at different rates. The differential expansion between adjacent parts causes the parts to rub against each other, which creates particles. These particles are then entrained into the flow path and contaminate the chamber. The particles remaining in the flow path may be entrained into the processing gas flow which contaminates a substrate during deposition processes. Particle contamination of the substrate reduces yield.

Therefore, what is needed is an apparatus and method for a mounting plate for supporting a gas diffuser in a processing chamber.

SUMMARY

Embodiments of the present disclosure generally provide apparatus and methods for a gas diffuser assembly for a vacuum chamber, the gas diffuser assembly comprising a mounting plate, the mounting plate comprising a hub, a plurality of curved spokes extending from the hub in a radial direction, a gusset portion coupled between the hub and each of the curved spokes, each of the gusset portions having a convex curve disposed in an axial direction, and one or more mounting holes coupled to the curved spokes.

In another embodiment, a gas diffuser assembly for a vacuum chamber is described that includes a mounting plate, the mounting plate comprising a hub, a plurality of spokes extending from the hub in a radial direction, a gusset portion coupled between the hub and each of the spokes, each of the gusset portions having a convex curve disposed in an axial direction, one or more mounting holes coupled to the curved spokes, and a threaded hole formed in the hub.

In another embodiment, a gas diffuser assembly for a vacuum chamber is described that includes a mounting plate, and a gas deflector coupled to the mounting plate by a single fastener. The mounting plate comprises a hub, a plurality of curved spokes extending from the hub in a radial direction, and one or more mounting holes coupled to the curved spokes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A is a bottom plan view of another embodiment of a mounting plate that may be utilized as the mounting plate of FIG. 1.

FIG. 4B is a side elevation view of the mounting plate of FIG. 4A.

FIG. 5A is a bottom plan view of another embodiment of a mounting plate that may be utilized as the mounting plate of FIG. 1.

FIG. 5B is a side elevation view of the mounting plate of FIG. 5A.

FIG. 6A is a bottom plan view of another embodiment of a mounting plate that may be utilized as the mounting plate of FIG. 1.

FIG. 6B is a side elevation view of the mounting plate of FIG. 6A.

FIG. 7A is a bottom plan view of another embodiment of a mounting plate that may be utilized as the mounting plate of FIG. 1.

FIG. 7B is a side elevation view of the mounting plate of FIG. 7A.

Figure 1:
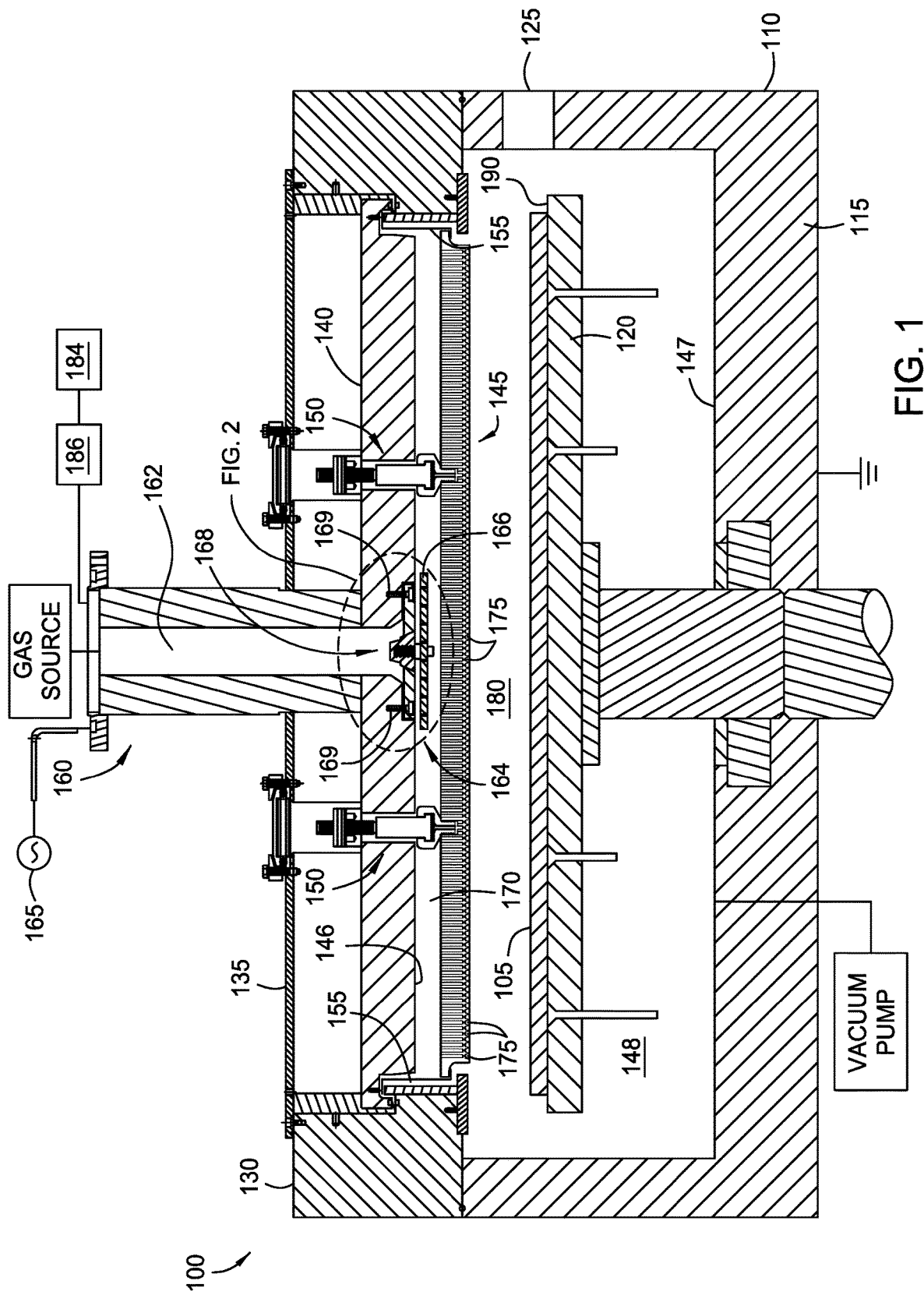
FIG. 1 is a schematic side cross-sectional view of one embodiment of a chamber.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present disclosure generally provide apparatus and methods for supporting a gas diffuser in a processing chamber. The disclosure will be described below in relation to a plasma enhanced chemical vapor deposition (PECVD) apparatus available from AKT America, Inc., a subsidiary of Applied Materials, Inc., Santa Clara, Calif. It is to be understood that the disclosure has applicability in other deposition chambers as well, including deposition chambers and PECVD apparatus available from other manufacturers.

FIG. 1 is a schematic side cross-sectional view of one embodiment of a chamber 100. The chamber 100 is suitable for PECVD processes for fabricating circuitry on a large area substrate 105 made of glass, a polymer, or other suitable substrate. The chamber 100 is configured to form structures and devices on the large area substrate 105 for use in the fabrication of liquid crystal displays (LCDs) or flat panel displays, photovoltaic devices for solar cell arrays, or other structures. The structures may be a plurality of back channel etch inverted staggered (bottom gate) thin film transistors which may comprise a plurality of sequential deposition and masking steps. Other structures may include p-n junctions to form diodes for photovoltaic cells.

The chamber 100 includes a chamber sidewall 110, a bottom 115, and a substrate support 120, such as a pedestal, which supports the large area substrate 105 during processing. The gas distribution showerhead 145 is positioned opposite the substrate support 120 and the large area substrate 105. The chamber 100 also has a port 125, such as a slit valve opening, that facilitates transfer of the large area substrate 105 into and out of the chamber 100 by selectively opening and closing. The chamber 100 also includes a lid structure 130, a backing plate 140, and a gas distribution showerhead 145. The lid structure 130 includes a lid plate 135. In one embodiment, the lid structure 130 supports the backing plate 140 and the gas distribution showerhead 145. In one embodiment, an interior surface 146 of the backing plate 140 and an interior surface 147 of the chamber sidewall 110 bounds a variable pressure region 148. In one aspect, the chamber 100 comprises a body which includes the chamber sidewall 110, the bottom 115 and the backing plate 140 bounding the variable pressure region 148. The backing plate 140 is sealed on its perimeter by suitable o-rings at interfaces where the backing plate 140 and the lid structure 130 may contact each other. The o-rings facilitate electrical insulation as well as seal the variable pressure region 148 when negative pressure is provided by a vacuum pump coupled to the chamber 100.

In one embodiment, the gas distribution showerhead 145 is supported by the backing plate 140 at a central region thereof by one or more center support members 150. The one or more center support members 150 facilitate support of the gas distribution showerhead 145 at the central region of the gas distribution showerhead 145 to control the horizontal profile of the gas distribution showerhead 145 to mitigate the tendency of the gas distribution showerhead 145 to droop or sag due to one or a combination of heat, gravity and vacuum. The gas distribution showerhead 145 may also be supported at a perimeter thereof by a flexible suspension 155. The flexible suspension 155 is adapted to support the gas distribution showerhead 145 from its edges and to allow lateral expansion and contraction of the gas distribution showerhead 145.

The chamber 100 is coupled to a gas inlet 160 that is coupled to a gas source and a plasma source 165. The plasma source 165 may be a direct current power source or a radio frequency (RF) power source. The RF power source may be inductively or capacitively coupled to the chamber 100. The gas inlet 160 delivers process gases from the gas source through a bore 162 to a gas diffuser assembly 164. The gas diffuser assembly 164 includes a perforated gas deflector 166 and a mounting plate 168. The mounting plate 168 is coupled to the backing plate 140 by a plurality of fasteners 169. The gas deflector 166 is fastened to a center of the mounting plate 168. The gas deflector 166 receives gases passing through the mounting plate 168 from the bore 162.

All of the backing plate 140, the gas deflector 166 and the mounting plate 168 may comprise a metallic material, such as aluminum.

Gases flow through the bore 162 to the mounting plate 168 and are spread by the gas deflector 166 into an intermediate region 170 defined between the backing plate 140 and the gas distribution showerhead 145. In one example of operation, process gases are delivered from the gas source while the interior of the chamber 100 has been pumped down to a suitable pressure by the vacuum pump. One or more process gases flow through the gas inlet 160 to the mounting plate 168 and the gas deflector 166 to the intermediate region 170 defined between the backing plate 140 and the gas distribution showerhead 145. The one or more process gases then flow from the intermediate region 170 through a plurality of openings or gas passages 175 formed through the gas distribution showerhead 145 to a processing region 180 defined in an area below the gas distribution showerhead 145 and above the substrate support 120.

The large area substrate 105 is raised from a transfer position to the processing region 180 by moving the substrate support 120 toward the gas distribution showerhead 145. The height of the processing region 180 may be varied as a process parameter based on a spacing between a lower surface of the gas distribution showerhead 145 and a substrate receiving surface 190 of the substrate support 120. The substrate support 120 may be heated by an integral heater, such as heating coils or a resistive heater coupled to or disposed within the substrate support 120.

A plasma may be formed in the processing region 180 by the plasma source 165 coupled to the chamber 100. The plasma excited gas is deposited onto the large area substrate 105 to form structures on the large area substrate 105. In one embodiment, the substrate support 120 is at ground potential to facilitate plasma formation in the processing region 180. A plasma may also be formed in the chamber 100 by other means, such as a thermally induced plasma. Although the plasma source 165 is shown coupled to the gas inlet 160 in this embodiment, the plasma source 165 may be coupled to the gas distribution showerhead 145 or other portions of the chamber 100.

After processing the substrate 105, the substrate 105 is transferred out of the chamber 100, and a cleaning process is performed. Cleaning gases, such as fluorine-containing gases, are provided from a cleaning gas source 184. The cleaning gases are ignited into a plasma in a remote plasma chamber 186. The plasma of cleaning gases flow through the bore 162 of the gas inlet 160, and through the mounting plate 168 where the plasma is spread by the gas deflector 166. The plasma then flows through the gas passages 175 of the gas distribution showerhead 145 in order to clean chamber interior surfaces.

Conventional gas diffusion apparatus include a separate part that is bolted or otherwise fastened to a lower surface of the backing plate 140 as a mounting plate for a deflector. However, the hot plasma causes differential expansion between the backing plate 140 and the mounting plate and/or differential expansion within the body of the mounting plate itself. Continued thermal cycling of the chamber 100 causes parts of the conventional gas diffusion apparatus to rub against the backing plate 140, particularly the conventional mounting plate, which causes particles. For example, the mounting points of the conventional mounting plates expand and rub against the backing plate, which creates particles. Additionally, the fasteners utilized to couple the conventional gas diffusion apparatus to the backing plate 140 include an anodized coating, which may wear off due to the differential expansion, which creates more particles. The particles have been found to entrain with gas flows in the chamber 100 and a portion of the particles contaminate the substrate.

Figure 2:
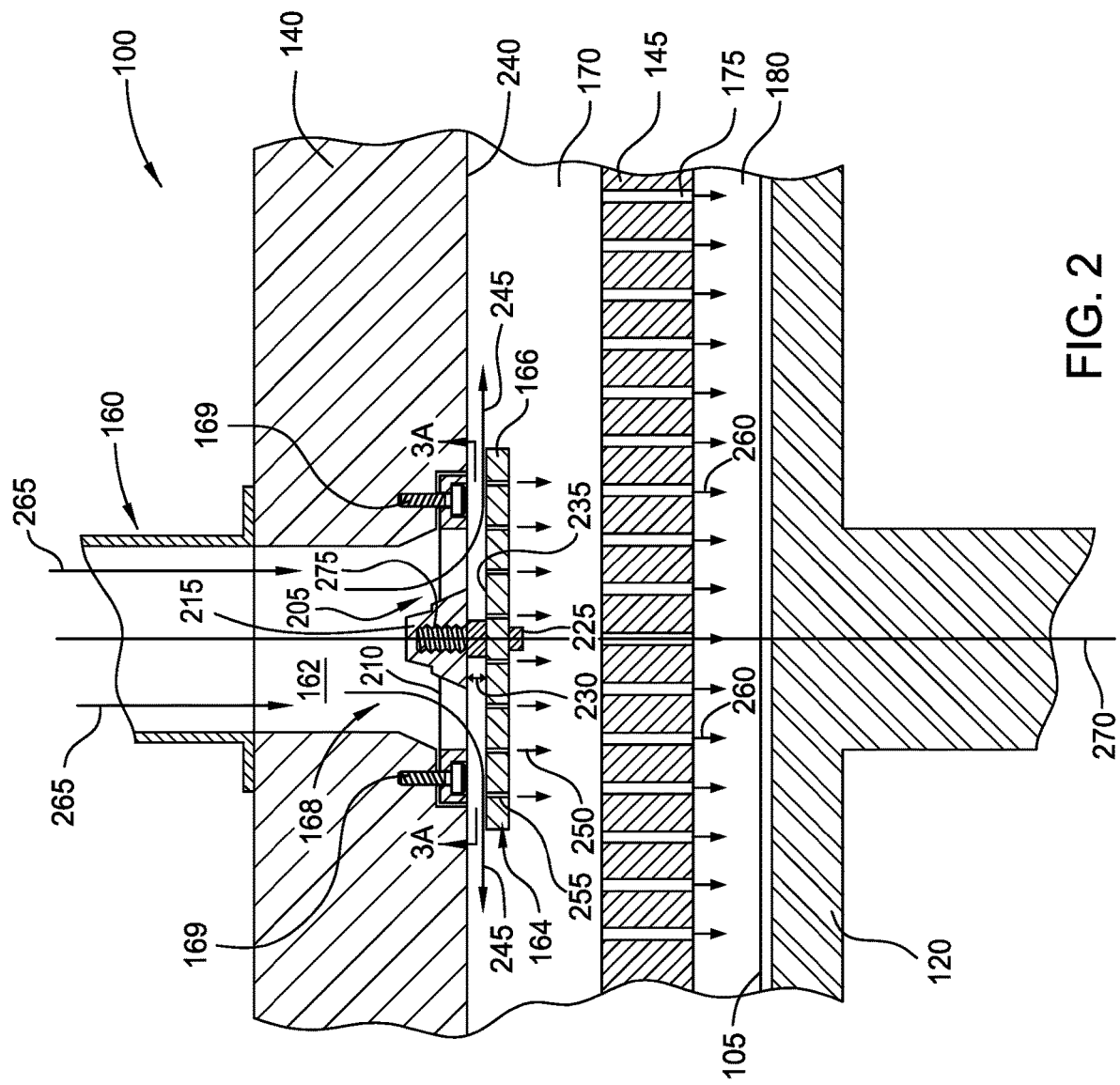
FIG. 2 is a partial schematic sectional view of the chamber having a gas diffuser support assembly in accordance with one embodiment of the disclosure.

FIG. 2 is a partial schematic sectional view of the chamber 100 having a gas diffuser assembly 164 in accordance with one embodiment of the disclosure. The gas diffuser assembly 164 comprises the mounting plate 168 coupled to the backing plate 140 and the gas deflector 166 coupled to the mounting plate 168.

Figure 3A:
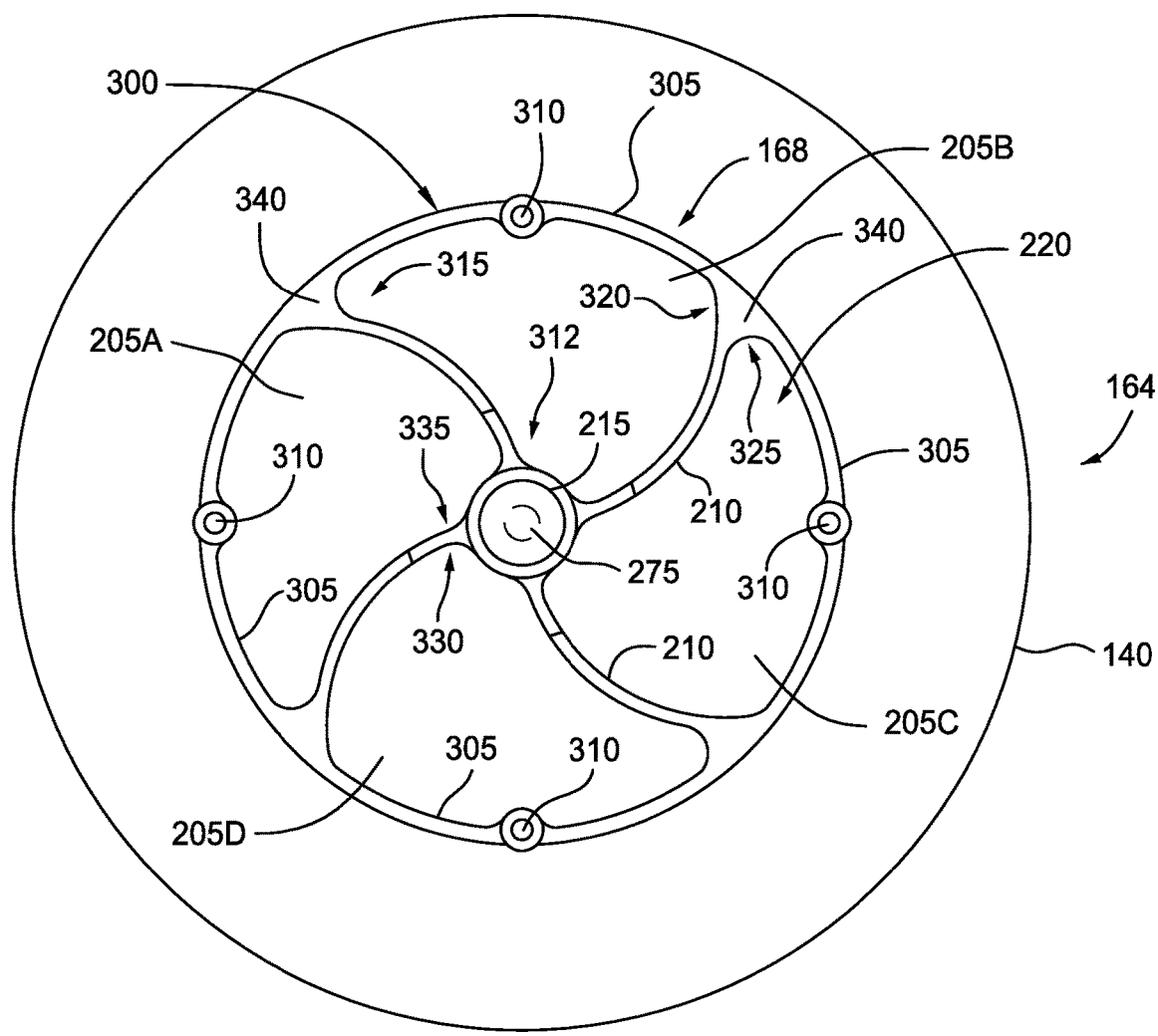
FIG. 3A is a bottom plan view of a portion of the a diffuser assembly along lines 3A-3A of FIG. 2.
Figure 3B:
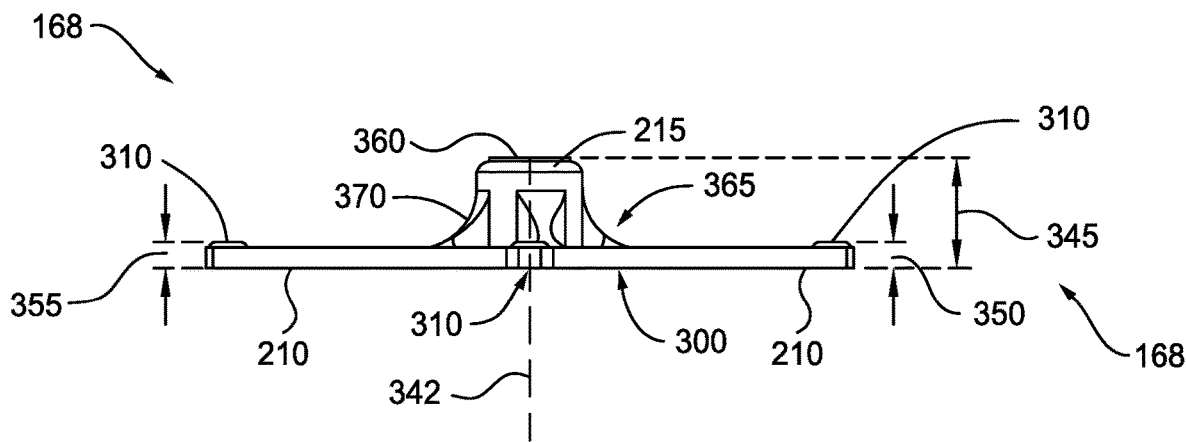
FIG. 3B is a side elevation view of the mounting plate of FIG. 3A.

FIG. 3A is a bottom plan view of a portion of the gas diffuser assembly 164 along lines 3A-3A of FIG. 2. FIG. 3B is a side elevation view of the mounting plate 168 of FIG. 3A.

As shown in FIGS. 2, 3A and 3B, the mounting plate 168 includes a plurality of openings 205A-205D (shown as 205 in FIG. 2). Each of the openings 205A-205D is separated by a spoke 210. Each of the spokes 210 are joined in a geometric center of the backing plate 140 at a hub 215.

In the embodiment shown, each of the spokes 210 are joined at a periphery thereof to a circular mounting structure 300. The mounting structure 300 includes a plurality of arc segments 305. Each of the plurality of arc segments 305 includes a mounting hole 310. Each mounting hole 310 receives one of the fasteners 169 (shown in FIG. 2).

Each of the spokes 210 comprise a cross structure 220. Each of the openings 205A-205D are provided in quadrants separated by the spokes 210. Each of the openings 205A-205D are sized to maximize gas flow or conductance. The open area of the openings 205A-205D is increased from conventional gas diffusion apparatus by about 50%, or greater, using the cross structure 220 as described herein. In one embodiment, the open area of the openings 205A-205D is about 7 square inches.

As shown in FIG. 3A, the spokes 210 have a first or proximal end 312 and a second or distal end 315 in a radial direction from the hub 215. The distal end 315 of each of the spokes 210 includes an obtuse angled portion 320 and an acute angled portion 325 in a radial direction. In some embodiments, the proximal end 312 of each of the spokes 210 includes an acute angled portion 330 and an obtuse angled portion 335 in the radial direction. A distal body 340 is formed by the obtuse angled portion 320 and the acute angled portion 325 of the spokes 210. In some embodiments (shown in FIGS. 4A, 5A, 6A and 7A), the mounting hole 310 is formed in the distal body 340.

Referring to FIG. 3B, the mounting plate 168 includes a first thickness or first height 345 in an axial direction 342. The first height 345 includes the hub 215. The mounting plate 168 includes a second thickness or second height 350 in the axial direction 342 that is less than the first height 345. The second height 350 includes the mounting holes 310. The mounting plate 168 includes a third thickness or third height 355 in the axial direction 342 that is less than the second height 350. The third height 355 includes a thickness of the majority of each of the spokes 210.

In some embodiments, the hub 215 of the mounting plate 168 includes a flat surface 360. The mounting plate 168 shown in FIG. 3B also includes gusset portions 365 disposed between the hub 215 and the spokes 210. Each of the gusset portions 365 have a thickness or height that is between the first height 345 and the third height 355. In the embodiment shown, the gusset portions 365 include a convex curve 370 in the axial direction 342 that transitions from the spokes 210 to the hub 215.

Referring again to FIG. 2, the mounting plate 168 is coupled to the backing plate 140 by the plurality of fasteners 169. The gas deflector 166 is coupled to the mounting plate 168 by a single fastener 225. The fastener 225 is a bolt or screw, such as a shoulder screw. The fastener 225 couples to a threaded hole 275 formed in the hub 215 (shown in phantom in FIG. 3A). The fastener 225 also maintains a gap 230 between an upper surface 235 of the gas deflector 166 and a lower surface 240 of the backing plate 140 and/or the mounting plate 168.

In operation, gases from the gas source of FIG. 1 or a plasma of cleaning gases from the remote plasma chamber 186 of FIG. 1 is flowed through the bore 162. The flow is provided along a conductance path through the openings 205A-205D of the mounting plate 168 into the intermediate region 170 defined between the backing plate 140 and the gas distribution showerhead 145. The conductance path includes multiple flow paths such as lateral flow paths 245 around the gas deflector 166 and downward flow paths 250 through a plurality of through-holes 255 formed in the gas deflector 166. The conductance path continues to the processing region 180 via flow paths 260 through the gas passages 175 formed through the gas distribution showerhead 145.

The spokes 210 are positioned at 90 degree intervals within the cross structure 220. In one embodiment, the spokes 210 are curved along the length or radial direction. The curved configuration and the thickness (third height 355) of the spokes 210 provides flexibility during temperature fluctuations that allows the mounting plate 168 to expand and contract at areas away from the fasteners 169. This prevents rubbing contact between the backing plate 140 and the mounting plate 168 which minimizes particle generation.

In one embodiment, the gap 230 (between the backing plate 140 and the gas deflector 166) is between about 0.15 inches to about 0.5 inches. In one embodiment, the gap 230 is about 0.25 inches.

In one embodiment, the through-holes 255 are evenly distributed across the major surfaces of the gas deflector 166. In one embodiment, each of the through-holes 255 has a diameter between about 0.05 inches to about 0.2 inches. In one embodiment, each through-hole 255 has a diameter of about 0.1 inches.

As shown in FIG. 2, the gas deflector 166 substantially blocks the majority of a vertical downward gas or plasma flow 265 from the bore 162 and generates lateral flow paths 245 that are substantially horizontal, which are substantially parallel to the backing plate 140 and the gas distribution showerhead 145. A small portion of the vertical downward gas or plasma flow 265 goes through the plurality of through-holes 255 in the gas deflector 166 and generates downward flow paths 250 that are generally parallel to a longitudinal axis 270 of the backing plate 140 and/or the chamber 100.

FIG. 4A is a bottom plan view of another embodiment of a mounting plate 400 that may be utilized as the mounting plate 168 of FIG. 1. FIG. 4B is a side elevation view of the mounting plate 400 of FIG. 4A.

The mounting plate 400 is similar to the mounting plate 168 with the following exceptions. The mounting plate 400 does not include the circular mounting structure 300 as shown in FIG. 3A. Instead, the mounting holes 310 are positioned on the ends of the spokes 210 in the distal body 340. Additionally, the gusset portions 365 include an angled planar surface 405 that transitions from the spokes 210 to the hub 215.

FIG. 5A is a bottom plan view of another embodiment of a mounting plate 500 that may be utilized as the mounting plate 168 of FIG. 1. FIG. 5B is a side elevation view of the mounting plate 500 of FIG. 5A.

The mounting plate 500 is similar to the mounting plate 400 with the following exceptions. The hub 215 of the mounting plate 500 includes a rounded surface 505 (shown in FIG. 5B). The mounting plate 500 also includes the gusset portions 365 having a convex curved portion 510 having a radius that is substantially similar to a radius of the rounded surface 505. The convex curved portions 510 are coupled to the spokes 210 by a concave portion 515 that is radially outward of the convex curved portion 510.

FIG. 6A is a bottom plan view of another embodiment of a mounting plate 600 that may be utilized as the mounting plate 168 of FIG. 1. FIG. 6B is a side elevation view of the mounting plate 600 of FIG. 6A.

The mounting plate 600 is similar to the mounting plate 500 with the following exceptions. The mounting plate 600 includes the gusset portions 365 having the convex curved portion 510 having a radius that is substantially similar to a radius of the rounded surface 505. The convex curved portions 510 are coupled to the spokes 210 by a sloped surface 605 that is radially outward of the convex curved portion 510.

FIG. 7A is a bottom plan view of another embodiment of a mounting plate 700 that may be utilized as the mounting plate 168 of FIG. 1. FIG. 7B is a side elevation view of the mounting plate 700 of FIG. 7A.

The mounting plate 700 is similar to the mounting plate 600 or the mounting plate 400 of FIGS. 4A-4B with the following exceptions. The mounting plate 700 includes the gusset portions 365 having the angled planar surface 405, but also includes an angled perimeter region 705 on the edge of the hub 215.

The gas diffuser assembly 164 as described herein substantially eliminates particle formation as well as other problems experienced with conventional gas diffusion apparatus. Stresses that may cause rubbing between parts are significantly reduced in the gas diffuser assembly 164 as described herein as compared to conventional gas diffusion apparatus. For example, maximum lateral deformation of the mounting plates as described herein is decreased by greater than 10%. The maximum vertical deformation is decreased by greater than 98% using the mounting plates as described herein. Maximum Von-Mises stress is decreased by about 80% using the mounting plates as described herein. Reaction force (indicating rubbing between the backing plate 140 and the conventional gas diffusion apparatus) is decreased by greater than 99% using the mounting plates as described herein. Reaction moment (indicating rubbing between mounting hardware of the conventional gas diffusion apparatus) is decreased by greater than 98% using the mounting plates as described herein.

While the foregoing is directed to embodiments of the present disclosure, other and further embodiments of the disclosure may be devised without departing from the basic scope thereof, and the scope thereof is determined by the claims that follow.

The invention claimed is:

1. A gas diffuser assembly for a vacuum chamber, the gas diffuser assembly comprising:
   a ring-shaped mounting plate, comprising:
      a hub;
      a plurality of curved spokes extending from the hub in a radial direction and interfacing with an arc segment at a distal end thereof, wherein a plurality of openings are formed in the ring-shaped mounting plate, each of the plurality of openings are bounded by the hub, the arc segment, and two of the plurality of curved spokes;
      a gusset portion coupled between the hub and each of the curved spokes, the gusset portion having a convex curve disposed in an axial direction; and
      one or more mounting holes positioned adjacent to the curved spokes.

2. The gas diffuser assembly of claim 1, wherein each of the mounting holes is formed in a circular mounting structure between the curved spokes.

3. The gas diffuser assembly of claim 1, wherein one of the one or more mounting holes is positioned at the distal end of each of the curved spokes.

4. The gas diffuser assembly of claim 1, wherein each of the curved spokes includes a distal body.

5. The gas diffuser assembly of claim 4, wherein each of the curved spokes includes an acute angled portion and an obtuse angled portion at the distal body.

6. The gas diffuser assembly of claim 1, wherein each of the curved spokes includes an acute angled portion and an obtuse angled portion.

7. The gas diffuser assembly of claim 1, wherein the hub includes a flat surface.

8. The gas diffuser assembly of claim 1, wherein the hub includes a rounded surface.

9. The gas diffuser assembly of claim 1, wherein each of the curved spokes include an obtuse angled portion adjacent to the gusset portion.

10. A gas diffuser assembly for a vacuum chamber, the gas diffuser assembly comprising:
    a ring-shaped mounting plate, comprising:
       a hub;
       a plurality of spokes extending from the hub in a radial direction and interfacing with an arc segment at a distal end thereof;
       a plurality of gusset portions coupled between the hub and the spokes, each of the gusset portions having a convex curve disposed in an axial direction;
       one or more mounting holes formed in the ring-shaped mounting plate between the spokes, wherein a plurality of openings are formed in the ring-shaped mounting plate, each of the openings being bounded by the hub, the arc segment, and two of the plurality of curved spokes; and
       a threaded hole formed in the hub.

11. The gas diffuser assembly of claim 10, wherein each of the mounting holes is disposed at a height that is greater than a height of the ring-shaped mounting plate.

12. The gas diffuser assembly of claim 10, wherein one of the one or more mounting holes is positioned at the distal end of each of the spokes.

13. The gas diffuser assembly of claim 10, wherein each of the spokes includes a distal body.

14. The gas diffuser assembly of claim 13, wherein each of the spokes includes an acute angled portion and an obtuse angled portion at the distal body.

15. The gas diffuser assembly of claim 10, wherein each of the spokes includes an acute angled portion and an obtuse angled portion.

16. The gas diffuser assembly of claim 10, wherein the hub includes a flat surface.

17. The gas diffuser assembly of claim 10, wherein the hub includes a rounded surface.

18. A gas diffuser assembly for a vacuum chamber, the gas diffuser assembly comprising:
    a ring-shaped mounting plate; and a gas deflector coupled to the ring-shaped mounting plate by a single fastener, wherein the mounting plate comprises:
a hub;
a plurality of curved spokes extending from the hub in a radial direction and interfacing with an arc segment at a distal end thereof, wherein a plurality of openings is formed in the ring-shaped mounting plate, and wherein each of the plurality of openings is bounded by the hub, the arc segment, and two of the plurality of curved spokes; and
one or more mounting holes coupled to the curved spokes.

19. The gas diffuser assembly of claim 18, wherein the plurality of curved spokes are positioned at 90 degree intervals on the hub.

20. The gas diffuser assembly of claim 18, wherein each of the curved spokes includes a distal body and an acute angled portion and an obtuse angled portion.

* * * * *